United States Patent
Chen et al.

(10) Patent No.: US 9,184,107 B2
(45) Date of Patent: *Nov. 10, 2015

(54) SEMICONDUCTOR PACKAGE

(71) Applicant: MediaTek Inc., Hsin-Chu (TW)

(72) Inventors: Tai-Yu Chen, Taipei (TW); Chung-Fa Lee, Dacun Township, Changhua County (TW); Wen-Sung Hsu, Zhubei (TW); Shih-Chin Lin, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/585,575

(22) Filed: Dec. 30, 2014

(65) Prior Publication Data

US 2015/0115429 A1    Apr. 30, 2015

Related U.S. Application Data

(63) Continuation of application No. 13/896,616, filed on May 17, 2013, now Pat. No. 9,000,581.

(60) Provisional application No. 61/651,496, filed on May 24, 2012.

(51) Int. Cl.
| *H01L 23/373* | (2006.01) |
| *H01L 23/36* | (2006.01) |
| *H01L 23/433* | (2006.01) |

(Continued)

(52) U.S. Cl.
CPC .......... *H01L 23/3736* (2013.01); *H01L 23/293* (2013.01); *H01L 23/3107* (2013.01); *H01L 23/36* (2013.01); *H01L 23/3675* (2013.01); *H01L 23/4334* (2013.01); *H01L 23/49816* (2013.01); *H01L 24/33* (2013.01); *H01L 2224/32225* (2013.01); *H01L 2224/33181* (2013.01); *H01L 2224/48095* (2013.01); *H01L 2224/48227* (2013.01); *H01L 2224/73265* (2013.01); *H01L 2924/14* (2013.01);

(Continued)

(58) Field of Classification Search
CPC .............. H01L 23/3736; H01L 23/293; H01L 23/3675; H01L 23/49816; H01L 24/33; H01L 2924/14; H01L 2924/15311; H01L 2224/32225; H01L 2224/33181

See application file for complete search history.

(56) References Cited

U.S. PATENT DOCUMENTS

| 5,610,442 | A | 3/1997 | Schneider et al. |
| 5,736,785 | A | 4/1998 | Chiang et al. |
| 5,904,497 | A | 5/1999 | Akram |
| 6,734,552 | B2 | 5/2004 | Combs et al. |
| 9,000,581 | B2 * | 4/2015 | Chen et al. ................. 257/712 |

(Continued)

FOREIGN PATENT DOCUMENTS

CN         101101881       1/2008

*Primary Examiner* — Roy Potter
(74) *Attorney, Agent, or Firm* — McClure, Qualey & Rodack, LLP (57) ABSTRACT

A semiconductor package with reduced warpage problem is provided, including: a circuit board, having opposing first and second surfaces; a semiconductor chip, formed over a center portion of the first surface of the circuit board, having a first cross sectional dimension; a spacer, formed over a center portion of the semiconductor chip, having a second cross sectional dimension less than that of the first cross sectional dimension; an encapsulant layer, formed over the circuit board, covering the semiconductor chip and surrounding the spacer; a heat spreading layer, formed over the encapsulant layer and the spacer; and a plurality of solder balls, formed over the second surface of the circuit board, wherein a ratio between the first cross sectional dimension and the second cross sectional dimension is about 1:2-1:6.

11 Claims, 8 Drawing Sheets

(51) Int. Cl.
*H01L 23/498* (2006.01)
*H01L 23/29* (2006.01)
*H01L 23/31* (2006.01)
*H01L 23/367* (2006.01)
*H01L 23/00* (2006.01)

(52) U.S. Cl.
CPC . *H01L2924/15311* (2013.01); *H01L 2924/351* (2013.01)

(56) References Cited

U.S. PATENT DOCUMENTS

| | | |
|---|---|---|
| 2002/0053724 A1 | 5/2002 | Lai et al. |
| 2006/0087033 A1 | 4/2006 | Goh et al. |
| 2006/0231944 A1 | 10/2006 | Huang et al. |
| 2007/0138656 A1 | 6/2007 | Khaw et al. |

\* cited by examiner

SEMICONDUCTOR PACKAGE

CROSS REFERENCE TO RELATED APPLICATIONS

This application is a Continuation of U.S. patent application Ser. No. 13/896,616, filed May 17, 2013 and entitled "Semiconductor package", now U.S. Pat. No. 9,000,581, which claims the benefit of U.S. Provisional Application No. 61/651,496 filed May 24, 2012, the entirety of which is incorporated by reference herein.

BACKGROUND OF THE INVENTION

1. Field of the Invention

The present invention relates to integrated circuit (IC) devices, and particularly to a semiconductor package with reduced warpage problem and improved thermal enhancement.

2. Description of the Related Art

A typical ball grid array (BGA) semiconductor package includes a semiconductor chip mounted on an upper surface of an insulating printed circuit board substrate. The substrate may be made of a glass fiber filled organic laminate, such as FR4 board, FR5 board, or BT board, and have interconnected conductive circuit patterns on upper and lower surfaces thereof. A hardened encapsulating material covers the chip, the upper surface of the substrate, and electrical conductors, such as bond wires, that extend between the chip and the circuit patterns on the upper surface of the substrate. Conductive balls or other input/output terminals are formed on the circuit patterns of the lower surface of the substrate.

Consistent with the trend toward smaller and thinner packages, one difficulty with such a BGA semiconductor package, however, is warpage of the semiconductor package due in part to temperature cycling during the manufacturing process and differences in the thermal expansion properties of the various materials of the package, e.g., differences in the thermal expansion properties of the substrate and encapsulating material. Where the package substrate is warped, the conductive balls or other input/output terminals on the lower surface of the substrate are uneven. This causes difficulty when mounting the package onto a motherboard. The magnitude of the warpage tends to increase as package size increases, and thus tends to impose an upper limit to the size of the package. Another emerging desire is to increase the thermal performance of package as power density is getter higher along the shrinkage of advanced wafer process node. In order to keep IC's functionality and reliability, IC's power consumption is required to be compliant with power limit of the package utilized, and thus restrict the function complexity of IC due to power limitation.

BRIEF SUMMARY OF THE INVENTION

An exemplary semiconductor package comprises a circuit board, having opposing first and second surfaces; a semiconductor chip, formed over a center portion of the first surface of the circuit board, having a first cross sectional dimension; a spacer spacer, formed over a center portion of the semiconductor chip, having a second cross sectional dimension less than that of the first cross sectional dimension; an encapsulant layer, formed over the circuit board, covering the semiconductor chip and surrounding the spacer; a heat spreading layer, formed over the encapsulant layer and the spacer; and a plurality of solder balls, formed over the second surface of the circuit board.

Another exemplary semiconductor package comprises a circuit board, having opposing first and second surfaces; a semiconductor chip, formed over a center portion of the first surface of the circuit board; a stiffener, formed over an edge portion of the first surface of the circuit board, surrounding the semiconductor chip; an encapsulant layer, formed over the circuit board, covering the semiconductor chip and surrounded by the stiffener; a heat spreading layer, formed over the encapsulant layer and the stiffener; and a plurality of solder balls, formed over the second surface of the circuit board.

Yet another exemplary semiconductor package comprises a circuit board, having opposing first and second surfaces; a semiconductor chip, formed over a center portion of the first surface of the circuit board; an encapsulant layer, formed over the circuit board, covering the semiconductor chip; a U-like shaped heat spreading layer, formed over the circuit board, comprising a first portion covering a top surface of the encapsulant layer and a second portion embedded in the encapsulant layer; and a plurality of solder balls, formed over the second surface of the circuit board.

Another exemplary semiconductor package comprises a circuit board, having opposing first and second surfaces; a semiconductor chip, formed over a center portion of the first surface of the circuit board, having a first cross sectional dimension; a spacer, formed over a center portion of the semiconductor chip, having a second cross sectional dimension less than that of the first cross sectional dimension; an encapsulant layer, formed over the circuit board, covering the semiconductor chip and surrounding the spacer; a heat spreading layer, formed over the encapsulant layer and the spacer; and a plurality of solder balls, formed over the second surface of the circuit board, wherein a ratio between the first cross sectional dimension and the second cross sectional dimension is about 1:2-1:6.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
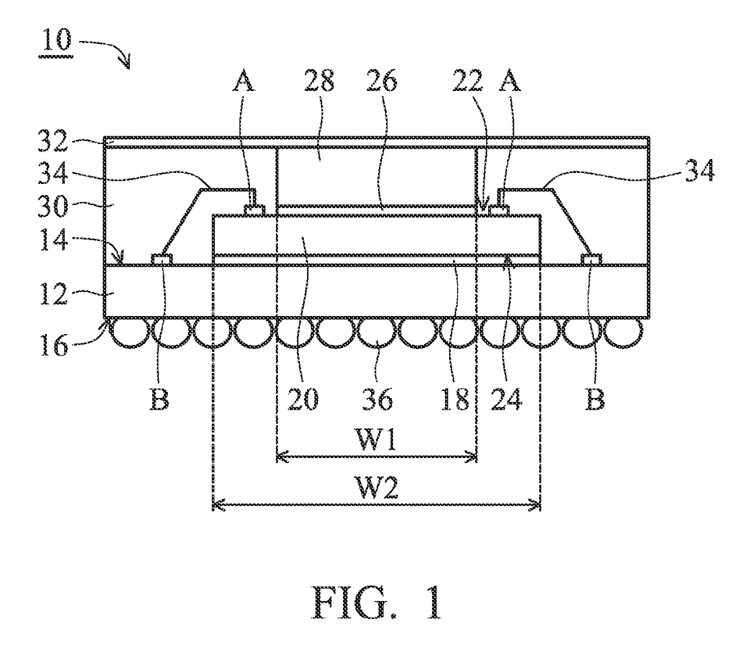
FIG. 1 is a cross section of a semiconductor package in accordance with an embodiment of the present invention.

FIG. 1 shows an exemplary semiconductor package 10 with reduced warpage problem, comprising a circuit board 12, a semiconductor chip 20, a spacer 28, an encapsulant layer 30, a heat spreading layer 32, and a plurality of conductive balls 36.

As shown in FIG. 1, the semiconductor chip 20 is, for example, a functional chip such as a microprocessor chip, a memory chip or other functional chips, and has an active first surface 22 and an inactive second surface 24. The first surface 22 of the semiconductor chip 20 comprises a plurality of input/output pads A located adjacent to the peripheral edges of first surface 22. The semiconductor chip 20 may be thinned by polishing the second surface 24. In one embodiment, the semiconductor chip 20 may have a coefficient of thermal expansion of about $2*10^{-6}$ m/m-K-$4*10^{-6}$ m/m-K.

The semiconductor chip 20 is mounted over a center portion of the circuit board 12 through a first adhesive layer 18. The circuit board 12 has opposing first and second surfaces 14 and 16, and the adhesive layer 18 and the semiconductor chip 20 are sequentially formed over the center portion of the first surface 14 of the circuit board 12. The circuit board 12 is mainly composed of a resin layer (not shown) formed from BT (bismaleimide triazine) board, FR 4 board, FR 5 board, or some other glass fiber filled organic (e.g., epoxy) laminate of the type used to make printed circuit board substrates for semiconductor packages. In addition, conductive traces and conductive interconnects (both not shown) are also formed in the circuit board 12, thereby providing suitable electrical connections between the semiconductor chip 20 and the conductive balls 36. In one embodiment, the circuit board 18 may have an overall coefficient of thermal expansion of about $4*10^{-6}$ m/m-K-$25*10^{-6}$ m/m-K. The first adhesive layer 18 may comprise epoxy, and have a coefficient of thermal expansion of about $30*10^{-6}$ m/m-K-$65*10^{-6}$ m/m-K.

As shown in FIG. 1, a plurality of bonding pads B and electrically conductive circuit patterns (not shown) are formed on the first surface 14 of the circuit board 12, and the conductive balls 36 are formed on the second surface 16 of the circuit board 12. Each input/output pad A of the semiconductor chip 20 is electrically connected to one of the bonding pads B by a conductive connections mean 34, which spans between the semiconductor chip 20 and the bonding pads. As shown in FIG. 1, the conductive connections mean 34 may be a bond wire formed of gold or aluminum.

In addition, the spacer 28 is mounted over a center portion of the first surface 22 of the semiconductor chip 20 through a second adhesive layer 28. The spacer 28, for example, is a rectangular non-functional chip made of a blank semiconductor wafer, and may comprise a semiconductor material which is the same as that of the semiconductor layer (not shown) of the semiconductor chip 20. The spacer 28 is formed with a cross sectional dimension, for example a width W1, smaller than that of a cross sectional dimension, for example a width W2, of the semiconductor chip 20, and a ratio between the first cross sectional dimension and the second cross sectional dimension is about 1:2-1:6. In one embodiment, the spacer 28 may have a coefficient of thermal expansion of about $2*10^{-6}$ m/m-K-$5*10^{-6}$ m/m-K.

The encapsulant layer 30 covers the first surface 22 of the semiconductor chip 20 and the first surface 14 of the circuit board 12, and surrounds the spacer 28 but does not cover a top surface of the spacer 28. The encapsulant layer 30 may be formed by molding and curing of a resin material (e.g., epoxy), or by pouring and curing of a liquid resin material (e.g., epoxy). The heat spreading layer 32 covers a top surface of the encapsulant layer 30 and a top surface of the second semiconductor layer 28. In one embodiment, the encapsulant layer 30 may have a coefficient of thermal expansion of about $5*10^{-6}$ m/m-K-$20*10^{-6}$ m/m-K. The heat spreading layer 32 may be formed of copper, aluminum, or other metal alloy, and have a coefficient of thermal expansion of about $12*10^{-6}$ m/m-K-$30*10^{-6}$ m/m-K, and a thickness of about 50-350 µm, and thermal conductivity of about 50-420 W/m-k.

The conductive balls 36, for example, are made of lead tin solder or some other metal, and serve as input/output terminals for the semiconductor package 10. The conductive balls 36 are each electrically connected to a respective input/output pad A of the semiconductor chip 20 through the connective connections means 34, the bonding pad B formed over the circuit board 12, and the conductive traces and conductive interconnects (both not shown) formed in the circuit board 12. The conductive Balls 36 allow the semiconductor package 10 to be mounted on a motherboard (not shown). Other configurations of input/output terminals are possible.

In the exemplary semiconductor package 10 shown in FIG. 1, the warpage problem is prevented, or at least reduced, by the provision of the spacer 28 and the heat spreading layer 32. The spacer 28 and the heat spreading layer 32 provide a robust frame which has direct bonding with the semiconductor chip 20 and therefore can impose a restriction on potential warpage comes from the circuit board 12.

Figure 2:
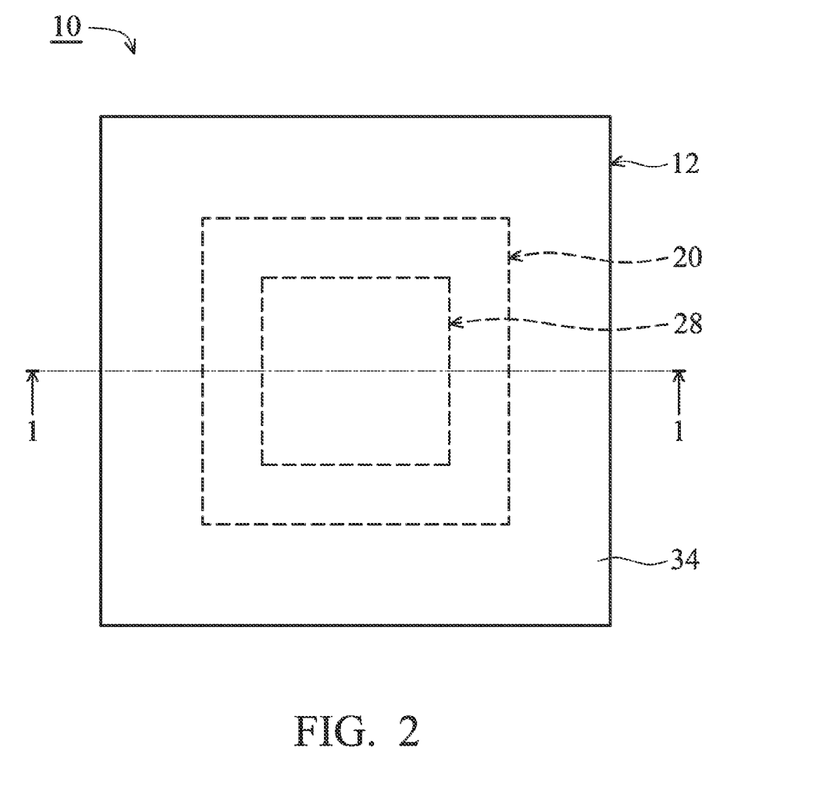
FIG. 2 is a schematic top view of the semiconductor package shown in FIG. 1.

FIG. 2 shows a schematic top view of the semiconductor package 10 shown in FIG. 1, and FIG. 1 shows a cross sectional view taken along line 1-1 in FIG. 2. In this embodiment, the heat spreading layer 32 entirely covers the circuit board 12, and only the semiconductor chip 20 and the spacer 28 are illustrated with dotted lines, for the purpose of simplicity.

Figure 3:
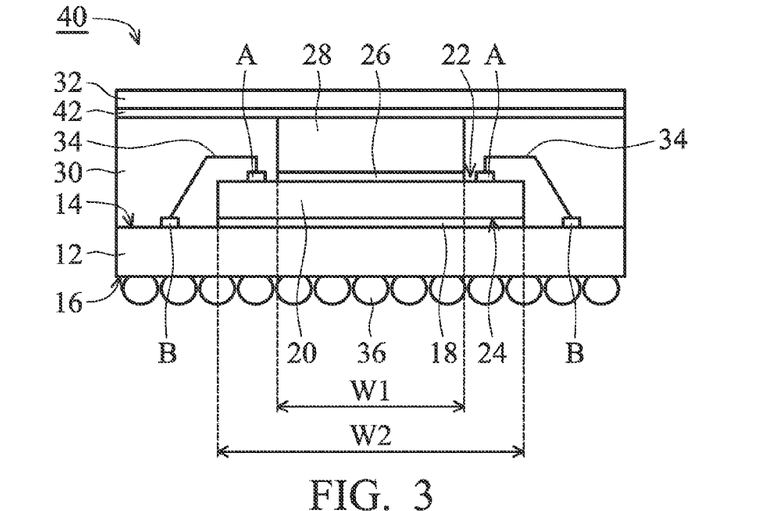
FIG. 3 is a cross section of a semiconductor package in accordance with another embodiment of the present invention.

FIG. 3 shows another exemplary semiconductor package 40 with reduced warpage problem, and the exemplary semiconductor package 40 is modified from the semiconductor package 10 shown in FIGS. 1 and 2. For the purpose of simplicity, the same components are illustrated with the same numerals and only differences between the semiconductor package 10 and 40 are discussed below.

As shown in FIG. 3, a thermal interlayer 42 is further provided between the heat spreading layer 32 and the spacer 28. In one embodiment, the thermal interlayer 42 may be formed of epoxy, and have a coefficient of thermal expansion of about $30*10^{-6}$ m/m-K-$65*10^{-6}$ m/m-K, and a thickness of about 5-100 µm.

In the exemplary semiconductor package 40 shown in FIG. 3, the warpage problem is prevented, or at least reduced, by the provision of the spacer 28, the thermal interlayer 42, and the heat spreading layer 32. The spacer 28, the thermal interlayer 42, and the heat spreading layer 32 provide a vertical path that may relieve thermal stresses accumulated in the circuit board 12 that would otherwise result in warpage.

Figure 4:
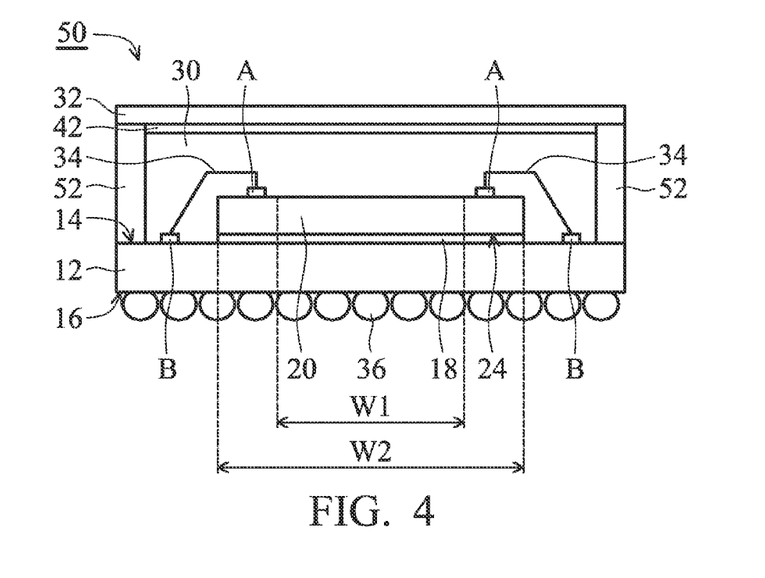
FIG. 4 is a cross section of a semiconductor package in accordance with yet another embodiment of the present invention.

FIG. 4 shows another exemplary semiconductor package 50 with reduced warpage problem, and the exemplary semiconductor package 50 is modified from the semiconductor package 40 shown in FIG. 3. For the purpose of simplicity, the same components are illustrated with the same numerals and only differences between the semiconductor packages 40 and 50 are discussed below.

As shown in FIG. 4, the spacer 28 and the second adhesive layer 26 are not formed in the semiconductor chip 20. Instead, a stiffener 52 is formed over an edge portion of the first surface 14 of the circuit board 12 to surround the semiconductor chip 20, and the encapsulant layer 30 formed over the circuit board 12 covers the semiconductor chip 20 and is now surrounded by the stiffener 52. The heat spreading layer 32 is formed over the encapsulant layer 30 and the stiffener 52, and the thermal interlayer 42 is provided between the heat spreading layer 32 and the stiffener 52. In one embodiment, the stiffener 52 may be formed of copper, aluminum, or other metal alloy, and have a coefficient of thermal expansion of about 50*10–6 m/m-K-420*10–6 m/m-K.

In the exemplary semiconductor package 50 shown in FIG. 4, the warpage problem is prevented, or at least reduced, by the provision of the stiffener 52, the thermal interlayer 42, and the heat spreading layer 32. The stiffener 52, the thermal interlayer 42, and the heat spreading layer 32 provide a robust frame which has direct bonding with the circuit board 12 and therefore can impose a restriction on potential warpage comes from the circuit board 12.

Figure 5:
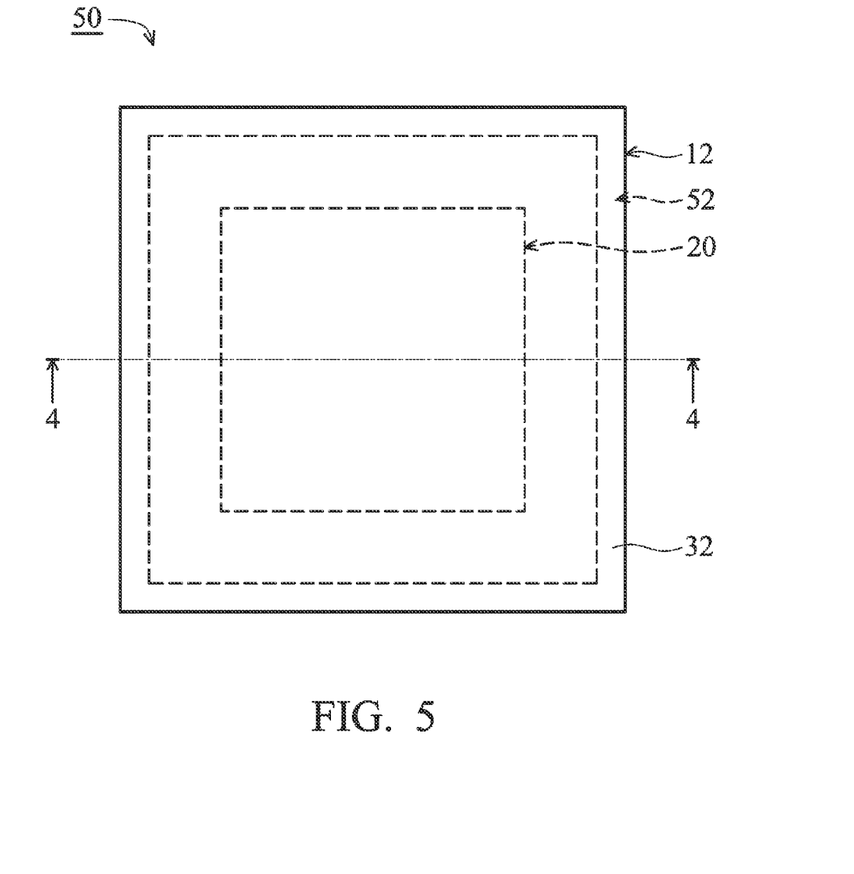
FIG. 5 is a schematic top view of the semiconductor package shown in FIG. 4.

FIG. 5 shows a schematic top view of the semiconductor package 50 shown in FIG. 4, and FIG. 4 shows a cross sectional view taken along line 4-4 in FIG. 5. In this embodiment, the heat spreading layer 32 entirely covers the circuit board 12. Meanwhile, only the semiconductor chip 20 and the stiffener 52 are illustrated with dotted lines, for the purpose of simplicity.

Figure 6:
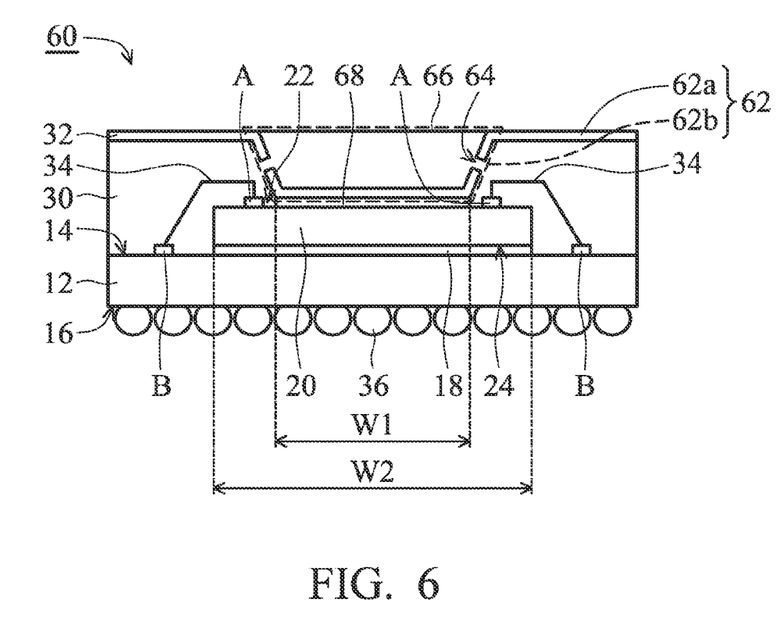
FIG. 6 is a cross section of a semiconductor package in accordance with another embodiment of the present invention.

FIG. 6 shows another exemplary semiconductor package 60 with reduced warpage problem, and the exemplary semiconductor package 60 is modified from the semiconductor package 10 shown in FIG. 1. For the purpose of simplicity, the same components are illustrated with the same numerals and only differences between the semiconductor packages 10 and 60 are discussed below.

As shown in FIG. 6, the spacer 28, the second adhesive layer 26 and the heat spreading layer 32 are not formed in the semiconductor package. Instead, a U-like shaped heat spreading layer 62 is formed over the circuit board 12, comprising a first portion 62a formed over a top surface of the encapsulant layer 30 and a second portion 62b embedded within the encapsulant layer 30. The second portion 62b of the U-like shaped heat spreading layer 62 is mounted over the semiconductor chip 20 through a third adhesive layer 68. A plurality of openings 64 are formed in the second portion 62b of the U-like shaped heat spreading layer 62 to allow a material of the encapsulant layer 30 to flow therethrough during formation thereof.

Figure 7:
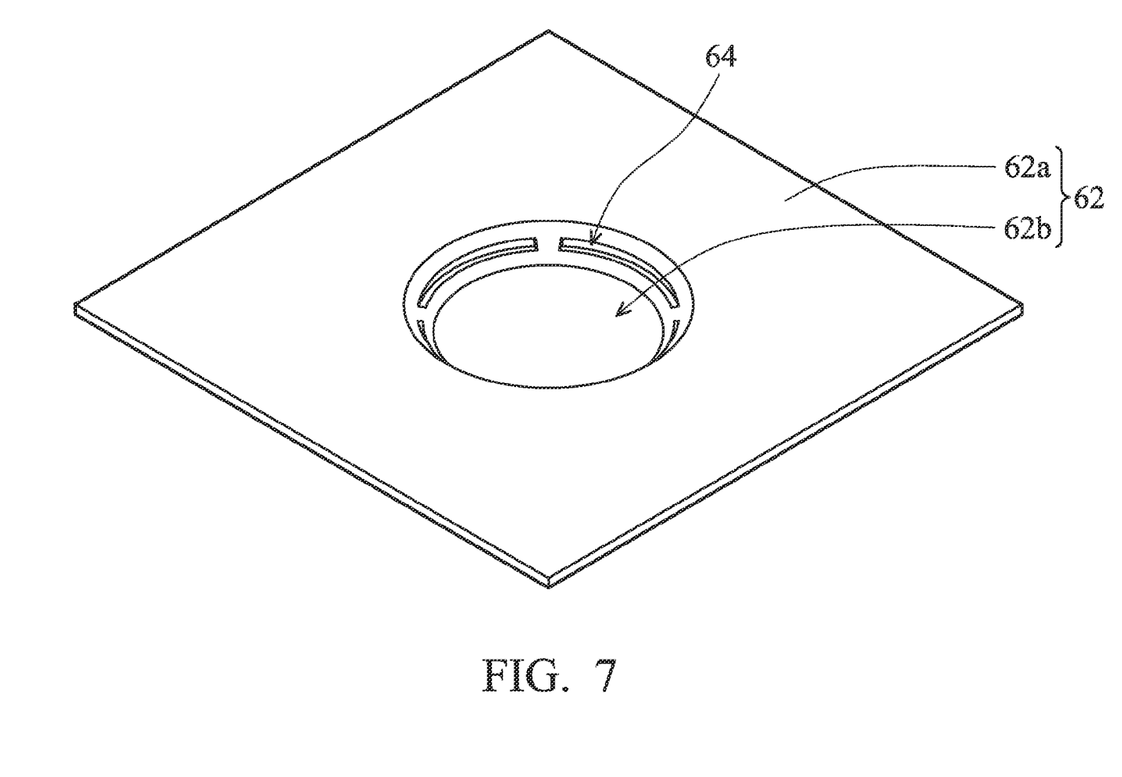
FIG. 7 is a schematic perspective view of a heat spreading layer of the semiconductor package shown in FIG. 6.

In one embodiment, the U-like shaped heat spreading layer 62 may be formed of copper, aluminum, or other metal alloy, and have a coefficient of thermal expansion of about $50*10^{-6}$ m/m-K-$420*10^{-6}$ m/m-K. The third adhesive layer 68 may be formed of epoxy, and have a coefficient of thermal expansion of about $30*10^{-6}$ m/m-K-$65*10^{-6}$ m/m-K. FIG. 7 is a perspective view showing the heat spreading layer 62 used in the semiconductor package shown in FIG. 6.

In the exemplary semiconductor package 60 shown in FIG. 6, the warpage problem is prevented, or at least reduced, by the provision of the U-like shaped heat spreading layer 62. The U-like shaped heat spreading layer 62 provides a robust frame which has direct bonding with the circuit board 12 and therefore can impose a restriction on potential warpage comes from the circuit board 12.

Figure 8:
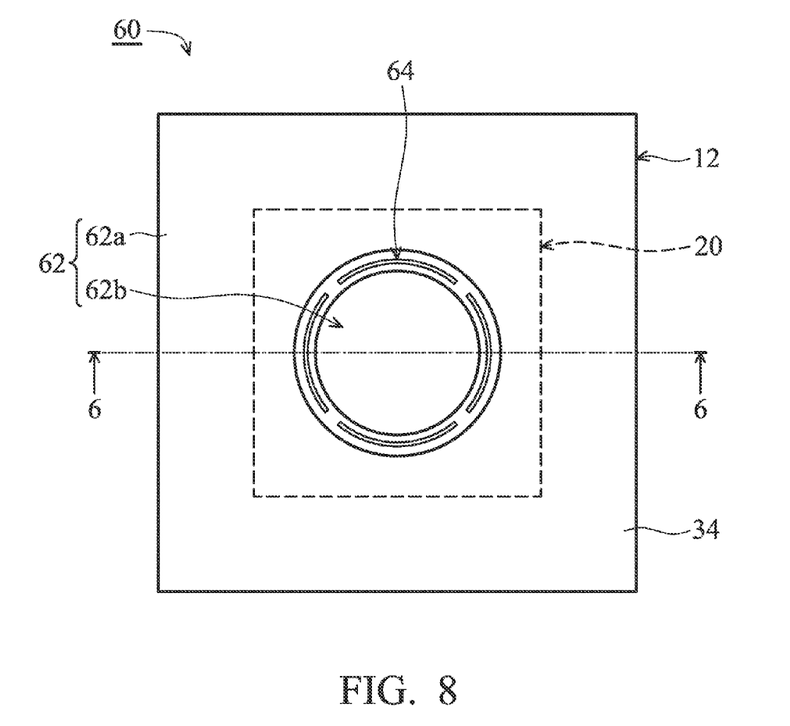
FIG. 8 is a schematic top view of the semiconductor package shown in FIG. 6.

FIG. 8 shows a schematic top view of the semiconductor package 60 shown in FIG. 6, and FIG. 6 shows a cross sectional view taken along line 6-6 in FIG. 8. In this embodiment, the U-like shaped heat spreading layer 62 entirely covers the circuit board 12, and the only the U-like shaped heat spreading layer 62, the opening 64 therein and the semiconductor chip 20 are illustrated, for the purpose of simplicity.

Figure 9:
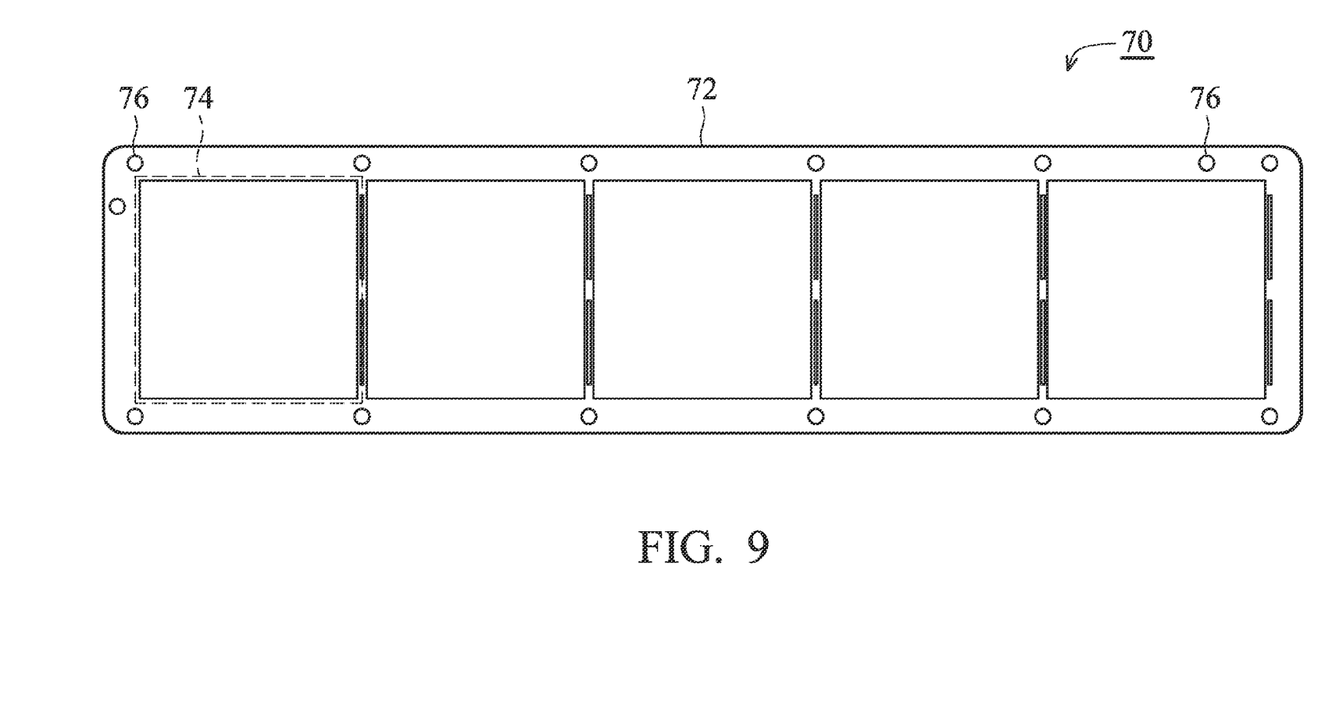
FIG. 9 is a schematic top view of a circuit board strip that may be used for fabricating the semiconductor package as shown in FIGS. 1, 3, 4 and 6.

The exemplary semiconductor packages 10, 40, 50, and 60 with reduced warpage problem disclosed above can be fabricated by a sawing-type wire-bond BGA packaging process. The components of the semiconductor packages 10, 40, 50, and 60 are fabricated from a circuit board strip. FIG. 9 is a schematic top view of an exemplary circuit board strip 70 that may be used for fabricating a plurality of the semiconductor packages 10, 40, 50, and 60 disclosed above. The circuit board strip 70 includes a main strip 72 composed of five circuit boards 74. Opposing rows of holes 76 are formed through the opposing peripheral portions of the main strip 72. The holes 76 allow for the alignment and advancement of the circuit board strip 100 in automatic processing equipment. Components in the plurality of the semiconductor packages 10, 40, 50, or 60 can be simultaneously fabricated over the five circuit boards 74 and then singulated into individual semiconductor packages 10, 40, 50, or 60 by a sawing process (not shown).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
    a circuit board, having opposing first and second surfaces;
    a semiconductor chip, formed over a center portion of the first surface of the circuit board, having a first cross sectional dimension;
    a spacer, formed over a center portion of the semiconductor chip, having a second cross sectional dimension less than that of the first cross sectional dimension;
    an encapsulant layer, formed over the circuit board, covering the semiconductor chip and surrounding the spacer;
    a heat spreading layer, formed over the encapsulant layer and the spacer; and
    a plurality of solder balls, formed over the second surface of the circuit board, wherein a ratio between the first cross sectional dimension and the second cross sectional dimension is about 1:2-1:6.

2. The semiconductor package as claimed in claim 1, wherein a first surface of the semiconductor chip comprises a plurality of input/output pads located adjacent to the peripheral edges of the first surface of the semiconductor chip.

3. The semiconductor package as claimed in claim 1, further comprising a thermal interlayer disposed between the heat spreading layer and the encapsulant layer and the spacer.

4. The semiconductor package as claimed in claim 1, further comprising a first adhesive layer, formed over the first surface of the circuit board and the semiconductor chip.

5. The semiconductor package as claimed in claim 1, further comprising a second adhesive layer, formed between the spacer and the semiconductor chip.

6. The semiconductor package as claimed in claim 1, wherein the heat spreading layer covers a top surface of the encapsulant layer and a top surface of the the spacer.

7. The semiconductor package as claimed in claim 1, wherein the semiconductor chip is a functional chip and the spacer is a non-functional chip.

8. The semiconductor package as claimed in claim 7, wherein the spacer comprises a semiconductor material the same as that of the semiconductor chip.

9. The semiconductor package as claimed in claim 1, wherein the heat spreading layer comprises copper or aluminum.

10. The semiconductor package as claimed in claim 3, wherein the thermal interlayer comprises epoxy.

11. The semiconductor package as claimed in claim 1, wherein the encapsulant layer is formed by molding and curing of a resin material, or by pouring and curing of a liquid resin material.

\* \* \* \* \*